(12) United States Patent
Oda et al.

(10) Patent No.: US 10,279,538 B2
(45) Date of Patent: May 7, 2019

(54) IMPRINTING METHOD AND IMPRINTING APPARATUS

(71) Applicant: DAI NIPPON PRINTING CO., LTD., Tokyo-to (JP)

(72) Inventors: Hirokazu Oda, Tokyo (JP); Takaharu Nagai, Tokyo (JP); Saburou Harada, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 429 days.

(21) Appl. No.: 14/431,592

(22) PCT Filed: Oct. 3, 2013

(86) PCT No.: PCT/JP2013/076973
§ 371 (c)(1),
(2) Date: Mar. 26, 2015

(87) PCT Pub. No.: WO2014/054749
PCT Pub. Date: Apr. 10, 2014

(65) Prior Publication Data
US 2015/0224703 A1  Aug. 13, 2015

(30) Foreign Application Priority Data

Oct. 4, 2012  (JP) ................................. 2012-221893

(51) Int. Cl.
*B29C 59/00* (2006.01)
*G03F 7/00* (2006.01)
*B29C 59/02* (2006.01)

(52) U.S. Cl.
CPC .......... *B29C 59/002* (2013.01); *B29C 59/022* (2013.01); *B29C 59/026* (2013.01); *G03F 7/0002* (2013.01)

(58) Field of Classification Search
CPC combination set(s) only.
See application file for complete search history.

(56) References Cited

U.S. PATENT DOCUMENTS

2002/0121077 A1* 9/2002 Kim ...................... B01D 46/10
                                                    55/385.1
2005/0072755 A1  4/2005 McMackin et al.
(Continued)

FOREIGN PATENT DOCUMENTS

JP       2002-359180     * 12/2002
JP      2002359180 A     12/2002
(Continued)

OTHER PUBLICATIONS

Dec. 24, 2013 International Search Report issued in International Application No. PCT/JP2013/076973.

*Primary Examiner* — Austin Murata
(74) *Attorney, Agent, or Firm* — Oliff PLC

(57) ABSTRACT

Provided are: an imprinting method which suppresses volatilization of a photocurable resin applied on a transfer-receiving substrate by an inkjet method, satisfactorily maintains the wet-spreading property of the resin at the time of transfer, maintains cleanness of the environment for transfer, and can fill the environment for transfer with a particular gas appropriate for transfer; and an imprinting apparatus. Disclosed is an imprinting method of using a template having a concavo-convex pattern formed thereon, and transferring the pattern of the template by imprinting to a photocurable resin on a transfer-receiving substrate, characterized in that, in a space where the template and the photocurable resin are brought into contact, clean air is sent to the space through an air blowing port during a standby mode of not performing imprinting, and the flow rate of clean air in the space is reduced or clean air is not sent during an imprinting mode.

8 Claims, 8 Drawing Sheets

(56) References Cited

U.S. PATENT DOCUMENTS

| | | | |
|---|---|---|---|
| 2006/0280829 A1 | 12/2006 | Kruijt-Stegeman et al. | |
| 2009/0267267 A1* | 10/2009 | Yoneda | B29C 37/0053 264/293 |
| 2011/0018167 A1 | 1/2011 | Koole et al. | |
| 2011/0038977 A1* | 2/2011 | Zheng | B29C 45/1753 425/225 |
| 2011/0189400 A1* | 8/2011 | Shinya | B05D 3/04 427/299 |
| 2011/0272838 A1* | 11/2011 | Malloy | B29C 33/38 264/39 |
| 2012/0228789 A1* | 9/2012 | Wakabayashi | B29C 59/02 264/39 |
| 2013/0113863 A1* | 5/2013 | Kodama | B82Y 10/00 347/68 |

FOREIGN PATENT DOCUMENTS

| | | | |
|---|---|---|---|
| JP | 2006013401 A | 1/2006 | |
| JP | 2006-352121 A | 12/2006 | |
| JP | 2007509769 A | 4/2007 | |
| JP | 2009266841 A | 11/2009 | |
| JP | 2011040736 A | 2/2011 | |
| JP | 2011096766 A | 5/2011 | |
| JP | 2012049471 A | 3/2012 | |
| JP | 2012-098337 A | 5/2012 | |
| JP | 2012186390 A | 9/2012 | |

* cited by examiner

STANDBY MODE

TRANSFER MODE

IMPRINTING METHOD AND IMPRINTING APPARATUS

TECHNICAL FIELD

The present invention relates to an imprinting method for transferring and forming a fine concavo-convex pattern, and an imprinting apparatus.

BACKGROUND ART

In recent years, particularly in regard to semiconductor devices, high speed operation and low power consumption operation are demanded as a result of further progress of micronization, and there is a demand for high-end technologies such as integration of functions called by the name of system LSI. Among such, regarding the lithography technology that becomes the key of the production of a pattern of a semiconductor device, it has been pointed out that there are limitations on the photolithographic method in view of the problem of exposure wavelength and the like occurring along the progress of micronization of a device pattern, and exposure apparatuses are extremely expensive.

As an alternative measure, a nanoimprint lithography (NIL) method using a fine concavo-convex pattern is attracting more attention. The nanoimprinting method suggested by Chou and others of Princeton University in 1995 is expected as a technology capable for forming a fine pattern having a high resolution of about 10 nm while the apparatus price, materials used and the like are inexpensive.

An imprinting method is a technology of pressing a template (also called a mold or a stamper) on which a nanometer-sized concavo-convex pattern has been formed in advance on the surface, on a transfer material such as a resin that has been formed by coating on the surface of a transfer-receiving substrate, so as to mechanically transform the substrate surface, thereby precisely transferring the concavo-convex pattern, and processing the transfer-receiving substrate using the imprint material having a pattern formed thereon as a resist mask. Once a template is produced, since a nanostructure can be repeatedly molded in a simple manner, a high throughput is obtained, and thus it is economically efficient. Also, since the technology is a nanoprocessing technology which produces hazardous waste materials to a less extent, in recent years, application of the technology is not limited to semiconductor devices, and application thereof in a variety of fields is in progress.

Regarding such an imprinting method, a thermal imprinting method of thermally transferring a concavo-convex pattern using a thermoplastic material; a photoimprinting method of transferring a concavo-convex pattern by ultraviolet radiation using a photocurable material; and the like are known. For the transfer material, a thermoplastic resin is used in the thermal imprinting method, and a photocurable resin or the like is used in the photoimprinting method. In the photoimprinting method, pattern transfer can be achieved at a low applied pressure at room temperature, so that heating/cooling cycles such as those employed in the thermal imprinting method are unnecessary, and dimensional changes in the template, or the resin caused by heat do not occur. Therefore, it is said that the photoimprinting method is excellent in view of resolution, the extent of alignment, productivity and the like. Hereinafter, in the present invention, a photoimprinting method is simply referred to as imprinting method.

The imprinting method has a problem that, as the processing process is repeated, generated nanometer-sized fine particles tend to adhere to the template or the like, and machining defects are increased. Thus, there has been suggested a microprocessing apparatus which sends clean air to the interior of an imprinting apparatus in order to create a satisfactory transfer environment inside the imprinting apparatus (see Patent Literature 1).

Furthermore, the imprinting method has a problem that a gas such as air penetrates between the template and the transfer-receiving layer, causing the occurrence of areas where the resin of the transfer material is not filled into the concavities of the pattern on the template, and transferability is deteriorated thereby. Thus, there have been suggested an imprinting system and an imprinting method, by which a first gas having a solubility in the transfer-receiving layer lower than that of air is supplied when a transfer-receiving layer is formed, and a second gas having a solubility in the transfer-receiving layer higher than that of air is supplied when the pattern is transferred, so as to eliminate areas where the resin is not filled in, and to enhance transferability (see Patent Literature 2).

CITATION LIST

Patent Literature

Patent Literature 1: Japanese Patent Application Laid-Open (JP-A) No. 2006-013401
Patent Literature 2: JP-A No. 2011-096766

SUMMARY OF INVENTION

Technical Problem

In the imprinting method, there are occasions in which use is made of a method of dropping a photocurable resin by an inkjet method that is capable of controlling the amount of application of a resin in accordance with the area of the pattern to be transferred, when a transfer-receiving layer is formed by applying a photocurable resin on a transfer-receiving substrate. However, the liquid droplets applied by an inkjet method are characterized by being very small and highly volatile. As a result of volatilization, not only the volume of liquid droplets is changed, but also the characteristics such as viscosity of the resin are also changed. For that reason, in order to perform imprinting, transfer has to be carried out while utilizing the fluidity intrinsic to the resin, by suppressing volatilization of the photocurable resin. The microprocessing apparatus described in the aforementioned Patent Literature 1 has a problem that although the influence of adhesion of fine particles can be reduced, since clean air is sent to the interior of the apparatus, it is difficult to suppress volatilization of the photocurable resin.

Furthermore, the invention described in Patent Literature 2 can increase transferability by filling the space to be transferred with a particular gas; however, there is a problem that the invention is highly prone to be affected by the adhesion of fine particles or foreign matters to the template or the transfer-receiving layer. Since the imprinting method is a technology of transferring a pattern by bringing the template into contact with the resin, the existence of fine particles or foreign matters in the area where transfer is conducted may instantaneously pose serious problems such as defects or damage of the template. Therefore, in order to maintain the interior of the apparatus clean, it is also necessary to provide a gas stream. Also, Patent Literature 2 has no consideration on the problem of volatilization of the photocurable resin.

As described above, there has been a problem that the conditions for filling the transfer environment with a particular gas without volatilizing the photocurable resin as an imprint material, and the conditions for maintaining the space for transfer clean are contradictory to each other.

Thus, the present invention was achieved in view of the problems described above. That is an object of the present invention is to provide an imprinting method and an imprinting apparatus, by which volatilization of the photocurable resin that is applied on a transfer-receiving substrate by an inkjet method is suppressed, the wet-spreading property of the resin at the time of transfer is maintained satisfactorily, cleanness of the environment for transfer is maintained by eliminating the influence of fine particles and foreign matters, and the environment for transfer can be filled with a particular gas appropriate for transfer.

Solution to Problem

In order to solve the problems described above, the imprinting method according to the present invention is an imprinting method using a template having a concavo-convex pattern formed thereon to transfer the pattern of the template by imprinting to a photocurable resin on a transfer-receiving substrate, characterized in that, in a space where the template and the photocurable resin are brought into contact, clean air is sent to the space through an air blowing port during a standby mode of not performing imprinting, and the flow rate of clean air that is sent to the space is reduced or clean air is not sent during an imprinting mode.

The imprinting method according to the present invention is characterized in that in a state in which the flow rate of clean air in the space is reduced or clean air is not sent, a gas that contributes to transfer is sent to the space.

The imprinting method according to the present invention is characterized in that the air blowing port can change the direction of the clean air sent to the space, and enables changing of the direction of the clean air during the standby mode of not performing imprinting and during the imprinting mode.

The imprinting method according to the present invention is characterized in that the air blowing port freely opens and closes, and a degree of the air blowing port is changed during the standby mode of not performing imprinting and during the imprinting mode.

The imprinting method according to the present invention is characterized in that the clean air described above is sent to the space during the standby mode of not performing imprinting, and a gas that contributes to the transfer is sent to the space during the imprinting mode, using the same air blowing port as the air blowing port.

The present invention provides an imprinting method using a template having a concavo-convex pattern formed thereon to transfer the pattern of the template by imprinting a photocurable resin on a transfer-receiving substrate characterized in that clean air is sent to a space where the template and the photocurable resin are brought into contact, a state in which the flow rate of the clean air sent to the space is reduced or clean air is not sent is achieved at least from the time point of initiation of the application of the photocurable resin on the transfer-receiving substrate by means of a resin coating unit to the time point of completion of light irradiation in a state in which the template is brought into contact with the photocurable resin, and within the time period set in the state in which the flow rate of the clean air is reduced or clean air is not sent, a gas that contributes to transfer is sent to the space.

According to the present invention, when a state in which the flow rate of clean air is reduced or clean air is not sent is achieve between the time points described above, volatilization of the photocurable resin can be reduced.

Furthermore, when a gas that contributes to transfer is sent within the time period set in a state in which the flow rate of the clean air is reduced or clean air is not sent, transfer can be carried out with high precision.

Moreover, when at least two kinds of gases such as clean air and the gas that contributes to transfer are used, the amount of use of the gas that contributes to transfer can be suppressed, and the cost can be reduced.

According to the present invention, it is preferable that the gas that contributes to transfer is sent in through an air blowing nozzle provided at the periphery of the space. It is because when the gas is sent in through the air blowing nozzle, the gas that contributes to transfer can be efficiently supplied to the space.

According to the present invention, it is preferable that the gas that contributes to transfer is nitrogen, helium, or pentafluoropropane. It is because oxygen in the space can be stably purged.

The imprinting apparatus according to the present invention is an imprinting apparatus which uses a template having a concavo-convex pattern formed thereon, and transfers the pattern of the template by imprinting the pattern to a photocurable resin on a transfer-receiving substrate, the imprinting apparatus comprising: a template retaining unit that retains the template; a transfer-receiving substrate retaining unit that retains the transfer-receiving substrate; a resin coating unit that applies a photocurable resin on the transfer-receiving substrate; a moving unit that moves the template and the transfer-receiving substrate relatively to each other; a position determining unit that aligns the template with the transfer-receiving substrate; and a unit that irradiates light from above a surface of the template where the pattern is not formed, in a state in which the template is brought into contact with the photocurable resin on the transfer-receiving substrate, characterized in that in a space where the template and the photocurable resin are brought into contact, clean air is sent to the space through an air blowing port during a standby mode of not performing imprinting, and the flow rate of clean air in the space is reduced or clean air is not sent during an imprinting mode.

The imprinting apparatus according to the present invention is characterized in that in the state in which the flow rate of clean air in the space is reduced or clean air is not sent, a gas that contributes to transfer is sent to the space.

The imprinting apparatus according to the present invention is characterized in that the air blowing port is capable of changing a direction of the clean air that is sent to the space, and changes the direction of the clean air during the standby mode and during the imprinting mode.

The imprinting apparatus according to the present invention is characterized in that the air blowing port freely opens and closes, and changes a degree of opening of the air blowing port during the standby mode of not performing imprinting and during the imprinting mode.

The imprinting apparatus according to the present invention is characterized in that the clean air is sent to the space during the standby mode of not performing imprinting, and the gas that contributes to transfer is sent to the space during the imprinting mode, using the same air blowing port as the air blowing port described above.

The imprinting apparatus according to the present invention is characterized in that the imprinting apparatus comprises a first space for performing imprinting, a second space on an outer side of the first space, a first partition that determines the boundary between the first space and the second space, a third space on an outer side of the second space, and a second partition that determines the boundary between the second space and the third space; and the second space is provided with a fan equipped with a temperature regulator, and air coming from the third space is subjected to circulation type air-conditioning in the second space and is sent to the first space through a ULPA filter.

The present invention provides an imprinting apparatus which uses a template having a concavo-convex pattern formed thereon and transfers the pattern of the template by imprinting the pattern to a photocurable resin on a transfer-receiving substrate, the imprinting apparatus comprising: a template retaining unit that retains the template; a transfer-receiving substrate retaining unit that retains the transfer-receiving substrate; a resin coating unit that applies a photocurable resin onto the transfer-receiving substrate; a moving unit that moves the template and the transfer-receiving substrate relatively to each other; a position determining unit that aligns the template with the transfer-receiving substrate; a unit that irradiates light in a state in which the template is brought into contact with the photocurable resin on the transfer-receiving substrate; an air blowing unit that has an air blowing port and sends clean air to a space where the template and the photocurable resin are brought into contact; and an air blowing nozzle that sends a gas that contributes to transfer to the space, characterized in that the air blowing unit achieves a state in which the flow rate of the clean air sent to the space is reduced or clean air is not sent, at least from the time point of initiation of the application of the photocurable resin on the transfer-receiving substrate by means of the resin coating unit to the time point of completion of light irradiation in a state in which the template is brought into contact with the photocurable resin, and the air blowing nozzle sends the gas that contributes to transfer to the space within the time period that the air blowing unit achieves the state in which the flow rate of the clean air sent to the space is reduced or clean air is not sent.

According to the present invention, when the state in which the flow rate of clean air is reduced or clean air is not sent is brought between the time points described above, volatilization of the photocurable resin can be reduced.

Furthermore, when the gas that contributes to transfer is sent within the time period that the flow rate of the clean air is reduced or clean air is not sent, transfer can be carried out with high precision.

Moreover, when at least two kinds of gases such as clean air and the gas that contributes to transfer are used, the amount of use of the gas that contributes to transfer can be suppressed, and the cost can be reduced.

According to the present invention, it is preferable that the gas that contributes to transfer is sent through the air blowing nozzle provided at the periphery of the space. It is because when the gas is sent through the air blowing nozzle, the gas that contributes to transfer can be efficiently supplied to the space.

According to the present invention, it is preferable that the gas that contributes to transfer is nitrogen, helium, or pentafluoropropane. It is because oxygen in the space can be stably purged.

Advantageous Effects of Invention

According to the imprinting method of the present invention, during a standby mode of not performing imprinting, the flow rate or direction of the clean air for maintaining the interior of the imprinting apparatus clean can be controlled, and thus volatilization of the photocurable resin can be suppressed.

According to the imprinting apparatus of the present invention, volatilization of the photocurable resin applied on a transfer-receiving substrate can be prevented, the wet-spreading property of the resin at the time of transfer can be maintained satisfactorily, cleanness of the environment for transfer can be maintained, and the environment for transfer can be filled with a particular gas appropriate for transfer.

DESCRIPTION OF EMBODIMENTS

Hereinafter, the imprinting method and imprinting apparatus according to exemplary embodiments of the present invention will be described in detail based on the drawings.

<Imprinting Method>

The imprinting method of the present invention is to temporarily change, during an imprinting mode, the flow rate or direction of clean air for maintaining the interior of an imprinting apparatus clean, in order to obtain a satisfactory environment for transfer inside the imprinting apparatus by eliminating the influence of fine particles or foreign matters, so that, when clean air is sent to the interior of the apparatus, the photocurable resin applied on a transfer-receiving substrate by an inkjet method is not volatilized unnecessarily due to volatilization promoted by clean air. For example, the imprinting method involves reduction of the flow rate of clean air or changing of the direction of flow.

Incidentally, the clean air may be external air blown in, and for example, it is preferable to use external air that has been passed through a filter. It is because the cost can be reduced.

Figure 1:
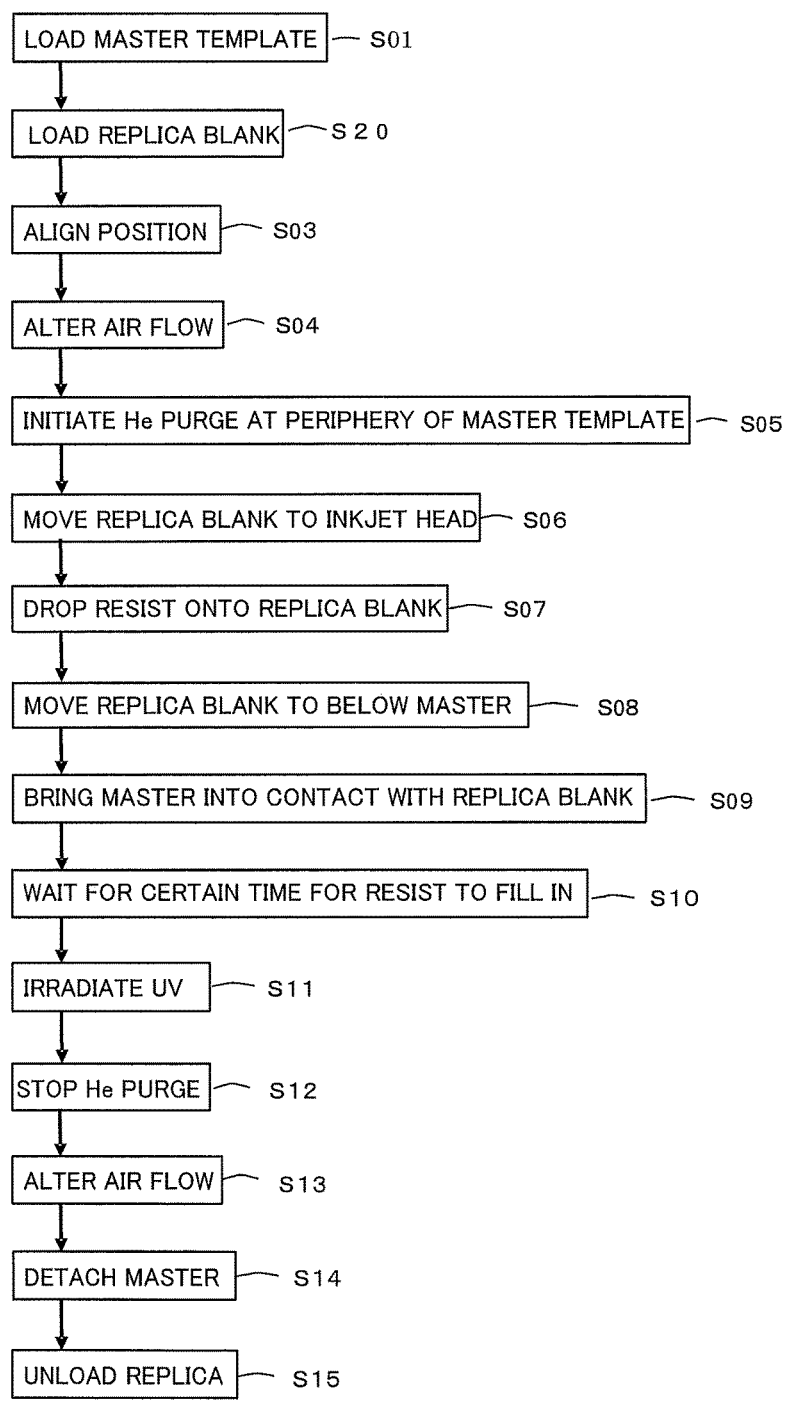
FIG. 1 is a flow chart illustrating an exemplary embodiment of an imprinting method of the present invention.
Figure 2:
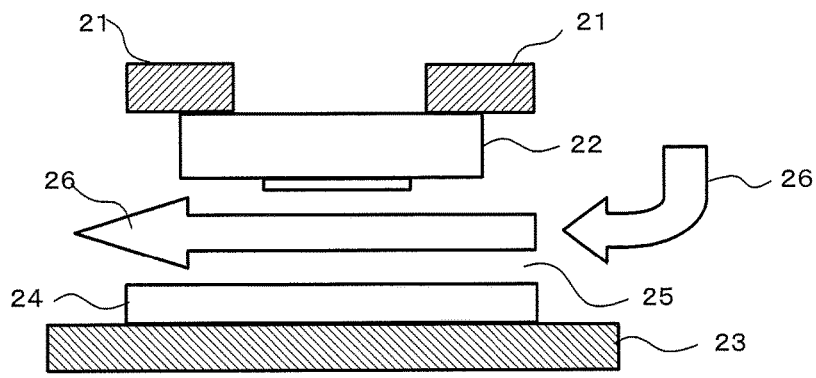
FIG. 2 is a schematic sectional view illustrating the relationship between an imprinting apparatus during a standby mode of not performing imprinting and clean air in the present invention.
Figure 3:
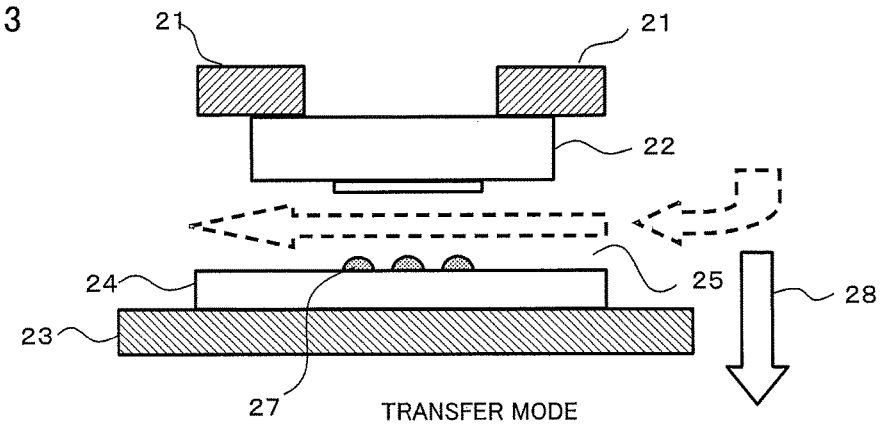
FIG. 3 is a schematic sectional view illustrating the relationship between the imprinting apparatus during an imprinting (transfer) mode and the clean air in the present invention.

FIG. 1 is a flow chart illustrating an exemplary embodiment of the imprinting process of the imprinting method of the present invention, and illustrates a process for producing by an imprinting method a template that serves as a replica from a template that serves as a master template. FIG. 2 is a schematic sectional view illustrating the relationship between the imprinting apparatus during a standby mode of not performing imprinting and the clean air in the present invention. FIG. 3 is a schematic sectional view illustrating the relationship between the imprinting apparatus during an imprinting (transfer) mode after the application of a photocurable resin and the clean air in the present invention.

The imprinting method of the present invention will be explained based mainly on the flow chart of FIG. 1.

First, a template having a concavo-convex pattern formed thereon (called a master template) is prepared, and the master template is retained (loaded) on a template retaining unit of an imprinting apparatus (Step S01).

Next, a transfer-receiving substrate is retained (loaded) on a transfer-receiving substrate retaining unit that retains the transfer-receiving substrate (Step S02). In the present exemplary embodiment, since a replica of the master template is produced, the transfer-receiving substrate is referred to as a replica blank.

Furthermore, in other exemplary embodiments, the transfer-receiving substrate may be semiconductor substrate, an optical element, or a magnetic recording medium.

Next, alignment between the master template and the transfer-receiving substrate (replica blank) is performed by means of a position determining unit (Step S03).

In the present invention, the period from Step S01 to Step S03 described above corresponds to a standby mode of not performing imprinting, and clean air is sent to the space between the master template and the transfer-receiving substrate (also referred to as replica template or replica blank), through an air blowing port on one end of the space, so as to maintain the interior of the apparatus performing imprinting in a normal condition by eliminating the influence of fine particles and foreign matters. In the present invention, the term space means a space where the template and the photocurable resin on the transfer-receiving substrate are brought into contact, and represents the space where imprinting is performed.

FIG. 2 is a schematic sectional view illustrating the relationship between the imprinting apparatus during the standby mode of not performing imprinting and the clean air in the present invention, and this is an example illustrating the state of Step S03 in which clean air is sent to the space where the master template is brought into contact with the transfer-receiving substrate. This illustrates the state of the standby mode of not performing imprinting, in which the template (master template) 22 is retained on the template retaining unit 21, and the transfer-receiving substrate (replica blank) 24 is retained on the transfer-receiving substrate retaining unit 23; however, a photocurable resin has not yet been applied on the transfer-receiving substrate 24. The template 22 and the transfer-receiving substrate 24 have not yet been brought into contact, and the space 25 between the two members is maintained wide, so that clean air 26 of a side flow is sent in.

The clean air according to the present invention is to be sent at least to the space; however, in addition to the space, it is preferable to have the clean air sent to the resin coating space, which is a space between the transfer-receiving substrate and the resin coating unit that applies a photocurable resin on the transfer-receiving substrate.

It is because the influence of fine particles and foreign matters can be reduced even in the resin coating space.

According to the present invention, among others, it is preferable that the clean air that is sent to the space and the resin coating space is sent through the same air blowing port.

It is because control of the gas stream of the clean air is easier. Also, it is because the apparatus can be simplified.

Furthermore, from such point of view, it is preferable that the space and the resin coating space are disposed within the same space, that is, application of a photocurable resin to the transfer-receiving substrate is carried out within the space where imprinting is performed by bringing the photocurable resin is brought into contact with the template.

It is because control of the gas stream of clean air is enabled until the processes of applying the photocurable resin and performing imprinting are completed, and volatilization of the photocurable resin can be more effectively suppressed. Furthermore, it is because volatilization of the photocurable resin can be suppressed through the overall operation of coating of the resin by means of a flow rate regulating unit, subsequent moving of the substrate, and imprinting.

In FIG. 2, the case of a side flow system as the gas stream of the clean air is taken as an example; however, a down flow system simulating an air curtain around the template, or a down flow system coming from the oblique upper side can also be applied.

Next, the flow of the clean air (air flow) is altered (Step S04). Specifically, the flow rate of the clean air 26 that is sent to the space 25 is reduced, or the clean air 26 is not sent to the space 25.

According to the present invention, in a case where clean air is sent to the space as well as the resin coating space, it is preferable that the flow rate of the clean air is reduced, or clean air is not sent, to the space as well as the resin coating space by the change of the air flow. It is because volatilization of the photocurable resin not only in the space but also in the resin coating space, and volatilization of the photocurable resin at the time of moving from the resin coating space to the space can also be suppressed, so that volatilization of the photocurable resin can be more effectively suppressed.

According to the present invention, it is preferable to send a gas that contributes to transfer, such as clean helium (He) gas or PFP (pentafluoropropane) gas, to the space after a state in which the flow rate of the clean air that is sent to the space is reduced compared with the flow rate during the standby mode of not performing printing, or in a state in which clean air is not sent, is achieved. Particularly, it is preferable to achieve a He-rich environment around the processing point of performing imprinting. When clean He gas is passed, cleanness inside the apparatus is also maintained. The gas such as He gas that contributes to transfer is a gas having a solubility in a photocurable resin higher than that of air, and has an effect of enhancing the transfer performance by eliminating the portions that are not filled with the photocurable resin in the concavities of the template. The gas also has an effect of purging oxygen in air that causes inhibition of the curing of a photocurable resin.

The gas that contributes to transfer according to the present invention is preferably a gas different from clean air.

It is because when a gas different from clean air, specifically external air, or external air that has passed through a filter, is used, the amount of use of the gas that contributes to transfer can be suppressed, and cost reduction can be promoted.

According to the present invention, among others, it is preferable that the gas that contributes to transfer is a gas which does not react with a photocurable resin and has an effect of purging oxygen in air that causes inhibition of the curing of a photocurable resin. It is because curing of a photocurable resin can be made easier.

According to the present invention, it is particularly preferable that the gas that contributes to transfer is a gas having a solubility in a photocurable resin higher than that of air. It is because the portions that are not filled with the photocurable resin in the concavities of the template can be eliminated.

Regarding the gas that contributes to transfer, specifically, nitrogen, helium, pentafluoropropane or the like can be preferably used. It is because these gases do not react with photocurable resins and can purge oxygen in air that causes inhibition of the curing of a photocurable resin.

According to the present invention, among others, the gas that contributes to transfer is preferably helium or pentafluoropropane. It is because these gases have a solubility in a photocurable resin higher than that of air, and can reduce the portions that are not filled.

Incidentally, the gas that contributes to transfer may be a gas of a single kind; however, the gas may also be a mixed gas composed of two or more kinds of gases.

Regarding the gas such as He gas, a method of sending the gas to the space through an air blowing port, a method of providing an air blowing nozzle at the periphery of the template and sending the gas, and the like are used.

According to the present invention, it is preferable that an air blowing nozzle is provided at the periphery of the space, and a gas that contributes to transfer is sent to the space therethrough. It is because the gas that contributes to transfer can be efficiently supplied to the space for performing imprinting. Also, it is because the amount of consumption of the gas can be reduced even in a case where the gas that contributes to transfer is disposed of after use.

Here, the periphery of the space refers to a position closer to the space as viewed from the above (in planar view), than the air blowing port through which clean air is sent to the space, and it is more preferable if the air blowing port of the air blowing nozzle is closer to an end of the space as viewed from the above.

Such an air blowing nozzle may be disposed on the template side, or may be disposed on the transfer-receiving substrate side. For example, a retaining unit at the periphery of the template may have the air blowing nozzle, or the transfer-receiving substrate retaining unit that retains the transfer-receiving substrate may have the air blowing nozzle.

The number of sites of disposition of the air blowing nozzle may be one site; however, among others, two or more sites are preferred, and four or more sites are particularly preferred. It is because the gas that contributes to transfer can be efficiently supplied to the space.

When the air blowing nozzles are disposed at two or more sites, the distances from the center of the template of the air blowing port to the air blowing nozzles may be different for each air blowing nozzles; however, it is preferable that the distances are the same. It is because the gas that contributes to transfer can be sent more uniformly to the space.

The air blowing nozzle is preferably a nozzle capable of adjusting the flow rate of the gas that contributes to transfer, which is sent in, and when the air blowing nozzles are disposed at two or more sites, it is preferable that each of the air blowing nozzles is capable of adjusting the flow rate independently. It is because the flow rate can be optimized in accordance with factors such as the kind and size of the photocurable resin, and the gas that contributes to transfer can be supplied efficiently to the space.

Furthermore, in a case where an air blowing nozzle is disposed at the periphery of the space, the direction of sending the gas through the air blowing nozzle as viewed from the above may be any direction by which the space can be filled with the gas, and for example, the direction can be set to a direction directed toward the center of the space from the periphery of the space. Also, the direction as viewed from the above can be set to a direction directed toward the center of the space.

Next, in the present exemplary embodiment, purging of He gas from the periphery of the master template is initiated (Step S05). Thereafter, He gas is sent to the space during the processes of performing imprinting, irradiating light to the photocurable resin, and thereby transferring a pattern. It is desirable if the He gas is maintained in a state of filling the space.

The flow rate of the gas that contributes to transfer in the present invention is not particularly limited as long as the gas is stably supplied to the space, and the flow rate is appropriately set according to factors such as the kind of the photocurable resin and the size of the space. However, for example, the flow rate can be set to the range of 1 L/min to 50 L/min. It is because when the flow rate described above is used, volatilization of the photocurable resin can be suppressed.

Next, a replica blank is moved to an inkjet head (Step S06), and the photocurable resin (resist) is dropped on the replica blank by an inkjet method (Step S07).

Regarding the method of dropping a photocurable resin onto a transfer-receiving substrate, there are no particular limitations as long as a method capable of stably dropping the photocurable resin on the transfer-receiving substrate by applying the photocurable resin thereon; however, specific examples thereof include an inkjet method and a dispenser method.

Furthermore, according to the present invention, the photocurable resin may be dropped in excess at the periphery of the transfer-receiving region, which is a region of the concavo-convex pattern to be transferred by a template of the photocurable resin that is dropped on the transfer-receiving substrate. It is because when an excess amount of the photocurable resin is dropped at the periphery of the transfer-receiving region, volatilization of the photocurable resin in the transfer-receiving region can be further suppressed by volatilization of the excess amount of the photocurable resin. Therefore, volatilization of the photocurable resin can be further suppressed in conjunction with a reduction in the flow rate of clean air and the like.

The site of dropping of the excess amount of the photocurable resin is not particularly limited as long as the site is at the periphery of the transfer-receiving region; however, when a step convex surface (mesa structure) for transfer reception is formed in the transfer-receiving region of the transfer-receiving substrate, the site of dropping may be disposed at the periphery of the mesa structure. Furthermore, when a step convex surface (mesa structure) for transfer is formed in the transfer-receiving region of the template, the site of dropping may be fixed on the transfer-receiving substrate corresponding to the periphery of the mesa structure.

Figure 4:
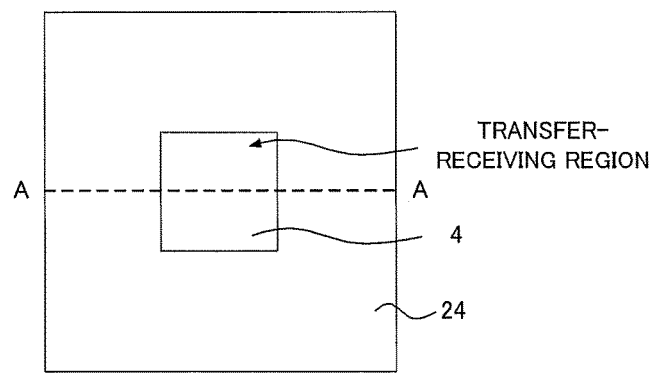
FIG. 4 is an outline plan view illustrating an example of a transfer-receiving substrate according to the present invention.
Figure 5A:
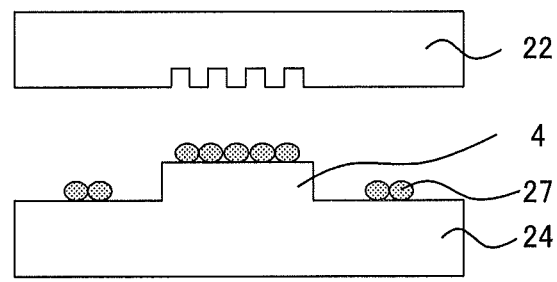
FIGS. 5A and 5B are line sectional views each illustrating an example of another exemplary embodiment of the imprinting method according to the present invention.
Figure 5B:
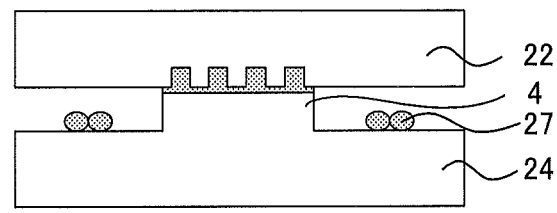
Figure 6A:
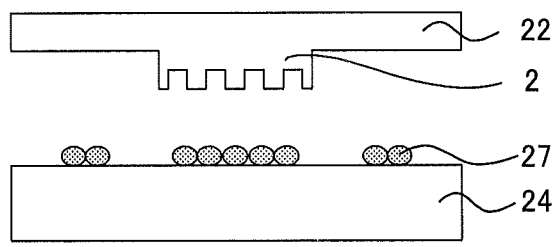
FIGS. 6A and 6B are line sectional views each illustrating an example of another exemplary embodiment of the imprinting method according to the present invention.
Figure 6B:
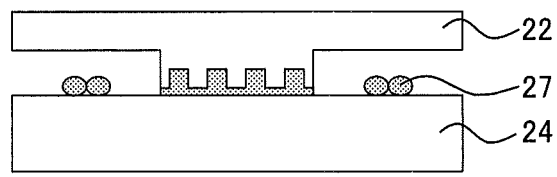

FIG. 4 is an outline plan view illustrating an example of the transfer-receiving substrate 24 having a mesa structure 4, and FIGS. 5A-5B and 6A-6B are each outline sectional views illustrating other exemplary embodiments of the imprinting method of the present invention, which illustrate methods of performing imprinting by dropping a photocurable resin at the periphery of a mesa structure (2 or 4). Furthermore, FIG. 4 and FIG. 5A illustrate the state before the contact between the template and the photocurable resin, and FIG. 5B illustrates the state at the time of contact between the template and the photocurable resin. Incidentally, the transfer-receiving substrate in FIGS. 5A and 5B illustrates the sectional view cut along the A-A line in FIG. 4.

According to the present invention, only the volatile components of the photocurable resin may be dropped at the periphery of the transfer-receiving region of the transfer-receiving substrate. It is because, when volatile components are dropped around, volatilization of the photocurable resin in the transfer-receiving region can be further suppressed.

The timing for the dropping of the volatile components is not particularly limited as long as any time point at which suppression of volatilization of the photocurable resin can be promoted is employed; however, a time point before the photocurable resin is brought into contact with the template (for example, before Step S09) is preferred. According to the present invention, among others, it is preferable that the time point is before the photocurable resin is moved to below the template (before Step S08), and it is particularly preferable that the time point is after the initiation of dropping of the photocurable resin onto the transfer-receiving substrate (after Step S07). It is because volatilization of the photocurable resin in the transfer-receiving region can be further suppressed effectively.

The site of dropping of the volatile components is not particularly limited as long as the site is at the periphery of the photocurable resin that is dropped on the transfer-receiving substrate, and for example, the site of dropping can be disposed at the periphery of the step convex surface (mesa structure) for transfer of the transfer-receiving substrate or template. Furthermore, regarding the periphery of the air blowing nozzle that is disposed at the periphery of the space, the volatile components may be actively sent to the space together with the gas that contributes to transfer, which is sent through the air blowing nozzle.

The method for dropping the volatile component is not particularly limited as long as it is a method capable of dropping the volatile components at desired sites, and the dropping can be carried out in the same manner as in the method for dropping the photocurable resin.

Incidentally, the volatile components may vary depending on the kind of the photocurable resin and the like, and examples thereof include low-molecular weight and low-boiling point components such as solvents and monomer components.

Next, the replica blank coated with the photocurable resin (resist) is moved again to below the master template (Step S08).

It is more preferable if the clearance between the replica blank and the master template at the time point at which the replica blank has moved to below the master template, that is, the clearance between the photocurable resin dropped on the transfer-receiving substrate and the template, is narrower. It is because the flow rate of the gas sent to the space can be decreased. Specifically, the distance may be adjusted to the range of 100 µm to 200 µm.

FIG. 3 is a schematic sectional view illustrating the relationship between the imprinting apparatus and clean air at the time of performing imprinting (transfer) in the present invention, and illustrates the state before imprinting of the template (master template) 22 and the transfer-receiving substrate (replica blank) 24 that has been aligned and coated with the photocurable resin (resist) 27. In the present exemplary embodiment, as a result of operating the air blowing port (not illustrated), the clean air 28 indicated by the solid line arrow is not sent to the space 25 by changing the direction. Thereby, the present exemplary embodiment has an advantage that another gas such as clean air is entrained when a gas such as He is sent, and the proportion of deteriorating the transferability is decreased. As described above, for example, He gas is purged from the periphery of the master template in the space 25 (not illustrated).

Next, the master template is brought into contact with the replica blank (Step S09), and it is waited, for a certain time, for the applied photocurable resin (resist) to fill the concavities of the pattern of the master template (Step S10).

Next, light (ultraviolet radiation; UV) is irradiated through the surface on which the pattern of the master template is not formed, in a state in which the master template is brought into contact with the photocurable resin (resist) of the replica blank, and the photocurable resin is cured (Step S11).

Furthermore, the time for irradiating light can be set to, for example, about 30 seconds.

Next, purging with He gas is stopped (Step S12), and the process of imprinting is completed. As described above, according to the present invention, the imprinting mode means the period ranging from the step after the alignment of the template and the transfer-receiving substrate, to the step of stopping the He gas after UV irradiation, and the exemplary embodiment illustrated in FIG. 1 shows from Step S04 to Step S12. The standby mode of not performing imprinting means steps other than the imprinting mode described above.

Next, alteration of the air flow is carried out simultaneously with the stopping of the purge with He gas, and clean air is sent to the space 25 through the air blowing port (Step S13).

Next, the master template is detached from the cured photocurable resin (Step S14), and the transfer-receiving substrate (replica blank) on which a pattern has been transferred to the photocurable resin is unloaded (Step S15).

In the exemplary embodiment described above, the steps of altering the air flow (S04 and S13) were explained based on FIG. 1; however, in the present invention, the alteration of the air flow in Step S04 can be carried out after the loading of the replica blank in Step S02 at the earliest, and before the dropping of the resist to the replica blank in Step S07 at the latest. Furthermore, the alteration of the air flow in Step S13 can be carried out while it is waited for a certain time for the resist to fill in Step S10 at the earliest, and before the unloading of the replica in Step S15 at the latest.

Furthermore, regarding another embodiment on the timing for the alteration of the air flow of clean air and the timing for sending the gas that contributes to transfer to the space, a state in which the flow rate of the clean air that is sent to the space is reduced or clean air is not sent is achieved at least from the time point of initiation of the application of the photocurable resin onto the transfer-receiving substrate by means of a resin coating unit to the time point of completion of light irradiation in a state in which the template is brought into contact with the photocurable resin, and the gas that contributes to transfer is sent to the space within the time period that the flow rate of the clean air sent to the space is reduced or clean air is not sent.

When such timing is employed, volatilization of the photocurable resin can be reduced, and transfer can be carried out with high precision. When at least two kinds of gases such as clean air and the gas that contributes to transfer are used, the amount of use of the gas that contributes to transfer can be suppressed, and the cost can be reduced.

Figure 7:
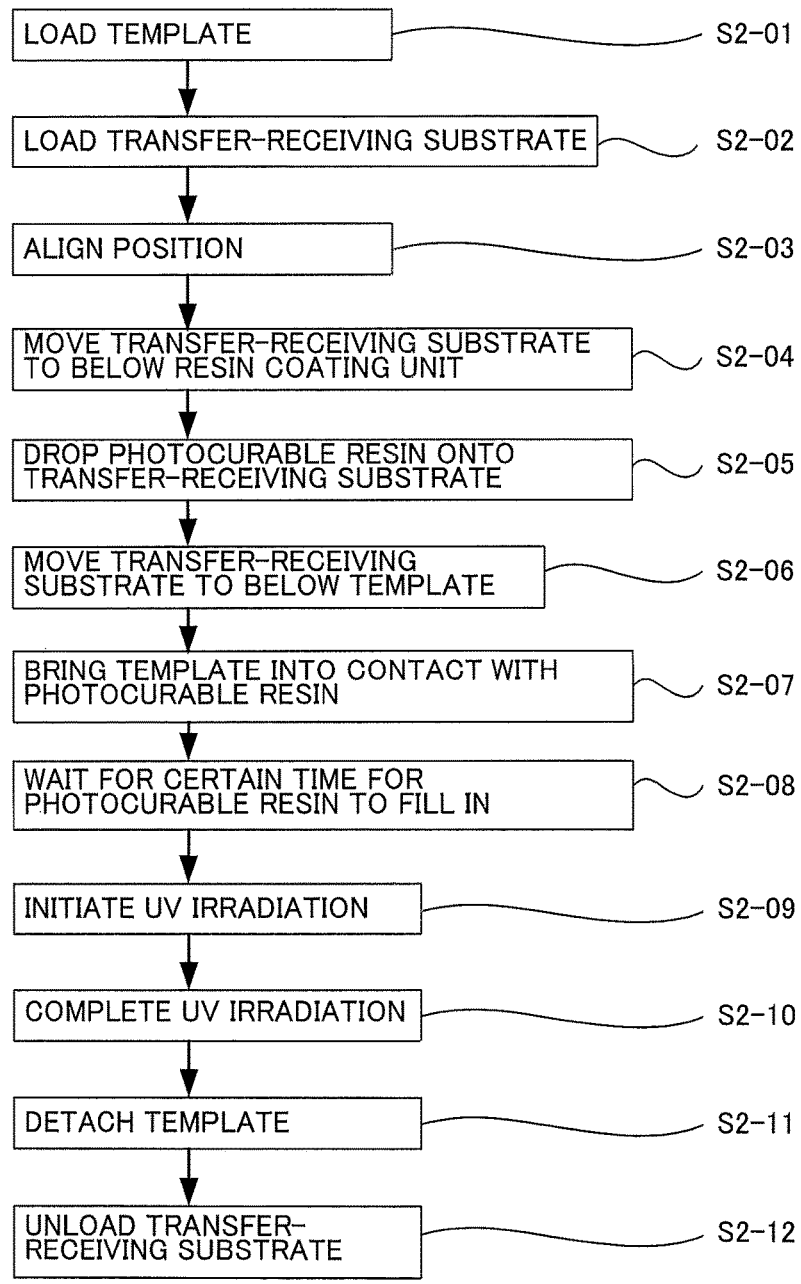
FIG. 7 is a flow chart illustrating another exemplary embodiment of the imprinting method of the present invention.

Regarding the timing of the alteration of air flow achieved by reducing the flow rate of the clean air that is sent to the space or by not sending any clean air, the time point is desirably at least before the time point of initiation of the application of the photocurable, resin on the transfer-receiving substrate by means of a resin coating unit. For example, in the case of performing imprinting by the steps shown in the flow chart presented in FIG. 7, the time point is desirably before the dropping of the photocurable resin onto the transfer-receiving substrate of Step S2-05 is initiated. However, among others, in the present invention, the time point is preferably after loading of the transfer-receiving substrate (after Step S2-02), and particularly preferably after alignment (after Step S2-03). Among them, the time point is particularly preferably after the transfer-receiving substrate is moved to below the resin coating unit (after Step S2-04). It is because volatilization of the photocurable resin can be effectively suppressed.

Furthermore, regarding the timing for the alteration of air flow by which the state in which the flow rate of the clean air that is sent to the space is reduced or clean air is not sent, is returned to the original state, the time point is desirably after completion of the light irradiation (after Step S2-10); however, among others, in the present invention, the time point is preferably before the template is detached (before Step S2-11).

When it is said that the gas that contributes to transfer is sent to the space within the time period that the flow rate of the clean air is reduced or clean air is not sent, it is implied that the gas that contributes to transfer is set to the space in any time period within the time period described above.

There are no particular limitations on the timing for the initiation of such sending of the gas that contributes to transfer, as long as the time point comes after the alteration of air flow, by which the flow rate of the clean air that is sent to the space is reduced or clean air is not sent. However, the time point is preferably before the template is brought into contact with the photocurable resin (for example, before Step S2-07 in FIG. 7); among others, the time point is preferably after the movement of the transfer-receiving substrate to below the resin coating unit is completed (after Step S2-04); and the time point is particularly preferably after the movement of the transfer-receiving substrate to below the template is completed (after Step S2-06). It is because curing of the photocurable resin can be carried out with high precision, and the amount of use of the gas that contributes to transfer can be reduced.

Furthermore, regarding the timing for stopping the sending of the gas that contributes to transfer, there are no particular limitations as long as the time point is before the alteration of air flow, by which the state in which the flow rate of the clean air that is sent to the space is reduced or clean air is not sent, is returned to the original state, and after the initiation of sending of the gas that contributes to transfer. However, the time point, is preferably after the waiting for a certain time for the photocurable resin to fill in (for example, after Step S2-08 in FIG. 7), and particularly preferably after the period of waiting for the photocurable resin to fill in (after Step S2-08). Furthermore, in the present invention, the time point is preferably before the template is detached (before Step S2-11), and among others, preferably before the completion of light irradiation (before Step S2-10). It is because curing of the photocurable resin can be carried out with high precision, and the amount of use of the gas that contributes to transfer can be reduced.

Although not illustrated in FIG. 1, the transfer-receiving substrate having a pattern transferred thereon is processed by using the photocurable resin having a pattern formed therein as a resist mask, and the resist mask is detached after the processing, one process is completed. When a new transfer-receiving substrate is loaded for the loading of replica blank shown in Step S02, a desired number of sheets of transfer-receiving substrates having patterns transferred thereon can be produced.

In the exemplary embodiment of the imprinting method of the present invention described above, a process flow following a method in which the transfer-receiving substrate (replica blank) is moved to below an inkjet head, a resist is applied, and then this replica blank is moved to the original position of below the master template has been explained. However, the present invention can also be used in, as other exemplary methods, a method in which the replica blank is fixed at a constant position, and the master template is moved; or a method in which the inkjet head is moved.

According to the imprinting method of the present invention, transferability can be enhanced by controlling the flow rate or direction of the clean air for maintaining the interior of the imprinting apparatus clean during the standby mode of not performing imprinting, and by filling the environment for transfer with a particular gas such as He appropriate for transfer during the imprinting mode, and thus a high quality transfer-receiving substrate having a pattern transferred thereon is obtained. Furthermore, when the method for altering the gas stream of the present invention is employed, the flow rate of the gas that contributes to transfer may be reduced, and volatilization of the photocurable resin can be suppressed.

Next, the imprinting apparatus of the present invention is explained.

<Imprinting Apparatus>

The imprinting apparatus of the present invention is to temporarily change the flow rate or direction of a gas stream for maintaining the interior of the imprinting apparatus clean during the imprinting mode, for example, by reducing the flow rate of clean air or changing the direction of flow, so that the photocurable resin applied on a transfer-receiving substrate by a inkjet method would not be unnecessarily volatilized by the gas stream of clean air.

Hereinafter, the invention is explained by way of Examples.

(First Example)

Figure 8:
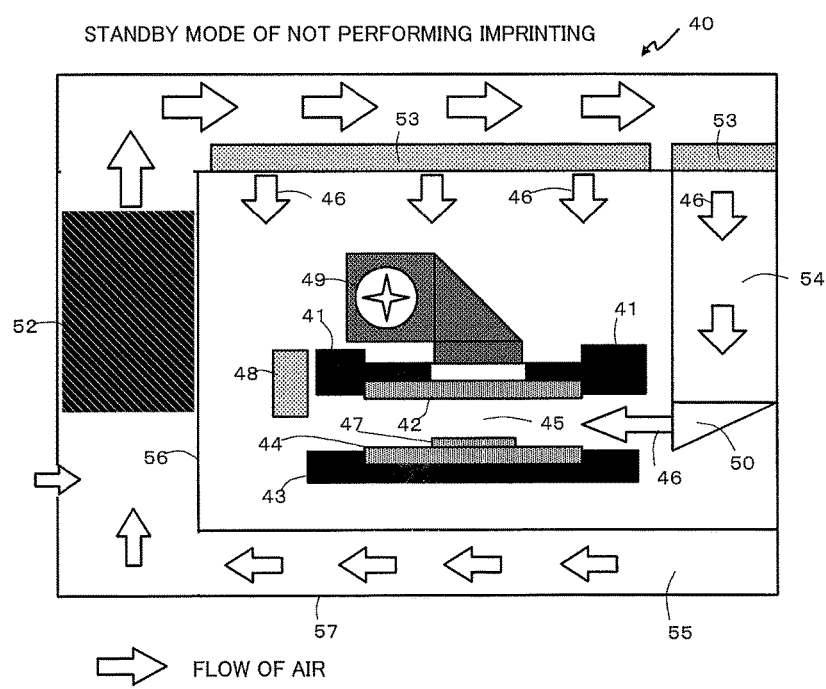
FIG. 8 is an outline schematic sectional view illustrating the relationship between the imprinting apparatus during the standby mode of not performing imprinting and the clean air in a first Example of the present invention.
Figure 9:
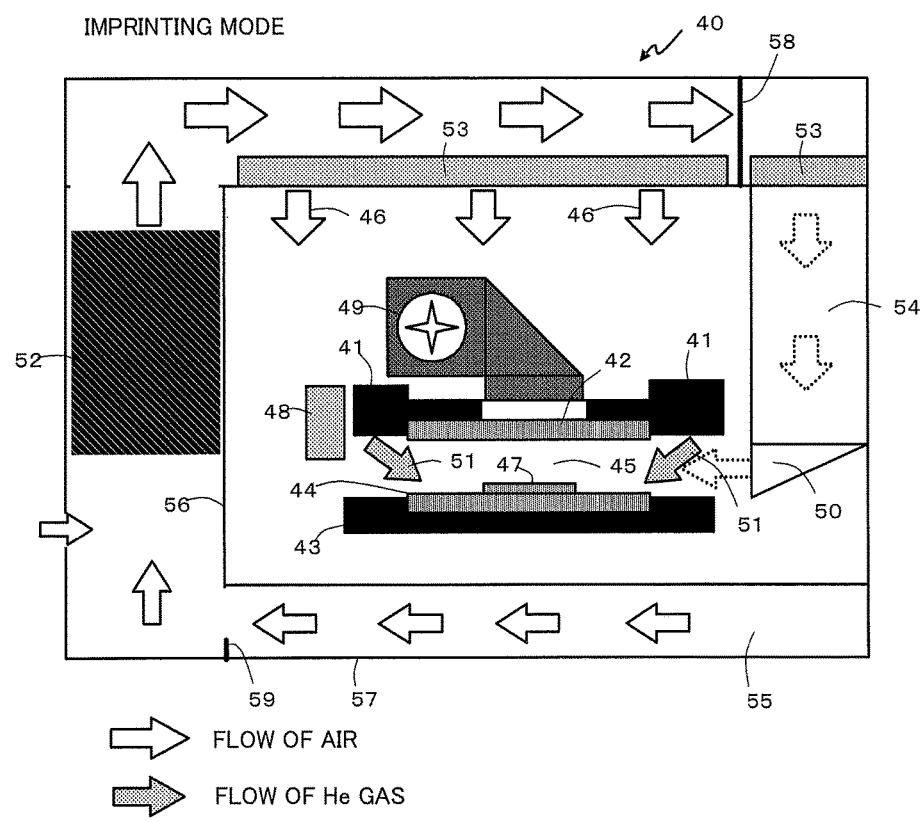
FIG. 9 is an outline schematic sectional view illustrating the relationship between the imprinting apparatus during an imprinting mode and the clean air and He gas in the first Example of the present invention.

FIG. 8 is an outline schematic sectional view illustrating the relationship between the imprinting apparatus and the clean air during a standby mode of not performing imprinting in a first Example of the present invention. FIG. 9 is an outline schematic sectional view illustrating the relationship between the imprinting apparatus and the clean air and He gas during an imprinting mode in the first Example. The outlined arrow in the view indicates the flow of air, while the arrow dotted in black and white indicates the flow of He gas. The same symbol is used in FIG. 8 and FIG. 9 for representing the same site.

As illustrated in FIG. 8, the imprinting apparatus 40 of the present Example is an imprinting apparatus which uses a template 42 having a concavo-convex pattern formed thereon and transfers the pattern of the template 42 by imprinting to a photocurable resin 47 on a transfer-receiving substrate 44, the imprinting apparatus comprising: a template retaining unit 41 that retains the template 42; a transfer-receiving substrate retaining unit 43 that retains the transfer-receiving substrate 44; a resin coating unit 48 that applies the photocurable resin 47 on the transfer-receiving substrate 44; a moving unit (not illustrated) that moves the template 42 and the transfer-receiving substrate 44 relative to each other; a position determining unit (not illustrated) that aligns the template 42 and the transfer-receiving substrate 44; and a unit 49 that irradiates light through from above the surface of the template 42 where the pattern is not formed, in a state in which the template 42 is brought into contact with the photocurable resin 47, characterized in that the space where the template 42 and the transfer-receiving substrate 44 are brought into contact is defined as a gas flow channel 45 of side flow, and clean air is sent to the space 45 as a gas stream to the space through an air blowing port 50 during a standby mode of not performing imprinting, while the flow rate of clean air 46 in the space is reduced or clean air is not sent during an imprinting mode.

Furthermore, the resin coating unit may be any unit capable of applying a photocurable resin and stably dropping on a transfer-receiving substrate, and specific examples thereof include an inkjet apparatus and a dispenser apparatus.

As illustrated in FIG. 9, it is preferable that the imprinting apparatus of the present Example sends a gas such as He gas 51 that contributes to transfer to the space 45, in a state in which the flow rate of clean air of the space 45 is reduced or clean air is not sent during the imprinting mode. The gas such as He gas that contributes to transfer is, as described above, a gas which has a solubility in a photocurable resin higher than that of air and has an effect of enhancing transferability by eliminating portions of concavities of the template that are not filled with the photocurable resin. For the gas such as He gas, a unit which sends the gas to the space 45 through the air blowing port 50, or as illustrated in FIG. 9, a unit which is provided with an air blowing nozzle at the periphery of the template 42 and sends the gas to the space 45 is used.

According to the present invention, it is preferable that an air blowing nozzle is provided at the periphery of the space and the gas that contributes to transfer is sent to the space. It is because the gas that contributes to transfer can be supplied efficiently to the space where imprinting is performed. Furthermore, it is because the amount of consumption of the gas can be reduced even when the gas that contributes to transfer is disposed of after use.

It is preferable to form the imprinting apparatus of the present Example such that, as illustrated in FIG. 8 and FIG. 9, the imprinting apparatus comprises a first space for performing imprinting, a second space on the outer side thereof, a first partition 56 that determines the boundary between the first space and the second space, a third space on the outer side of the second space, and a second partition 57 that determines the boundary between the second space and the third space; and the second space is provided with a fan 52 equipped with a temperature regulator, and the air coming in from the third space is subjected to circulation type air-conditioning in the second space, and is blown as clean air to the first space through a ULPA (Ultra Low Penetration Air Filter) filter 53 from the upper part of the first space. In regard to imprinting, since temperature stability of air is important, circulation type air-conditioning is used.

Furthermore, since the resin coating unit and the template are both disposed, that is, both the space and the resin coating space are disposed within the first space for performing imprinting, control of the gas stream of clean air is made easier and volatilization of the photocurable resin can be more effectively suppressed until the processes of application of a photocurable resin to imprinting are completed. Furthermore, in the space in front of movable shutters 58 and 78, which are units for regulating the flow rate of clean air, a region in which the photocurable resin is applied on the transfer-receiving substrate by means of the resin coating unit and a region in which the photocurable resin and the template are arranged to face each other and are brought into contact, are spatially integrated. Therefore, volatilization of the photocurable resin can be suppressed throughout the overall operations from resin application by regulating a flow rate regulating unit to moving of the substrate and imprinting.

In the present Example, as illustrated in FIG. 8, the first space includes a side flow duct 54 equipped with a ULPA filter, and a gas stream of clean air is sent by side flow from an air blowing port 50 to the space 45. The clean air that fills the first space is circulated through a return duct provided in the lower part of the second space. The third space, the second space and the first space respectively control the pressure in this order so as to obtain positive pressures, and thus the influence of dust is reduced.

In the imprinting apparatus 40 of the present Example, the air blowing port 50 can change the direction of a gas stream of clean air 46 that is sent to the space 45. During the standby mode of not performing imprinting as illustrated in FIG. 8, the gas stream of clean air 46 is sent to the space 45 through the air blowing port 50; however, in the example of the imprinting mode illustrated in FIG. 9, a movable shutter 58 led to the air blowing port is closed, and the gas stream of clean air 46 does not flow through the side flow duct 54. At this time, a damper 59 of the return duct is set to be slightly closed in conjunction with the movable shutter 58. By controlling the degree of opening of the movable shutter 58, the degree of opening of the air blowing port can be changed, and thereby the flow rate of clean air in the space 45 can be reduced, or it can be made not to send clean air to the space 45.

(Second Example)

Figure 10:
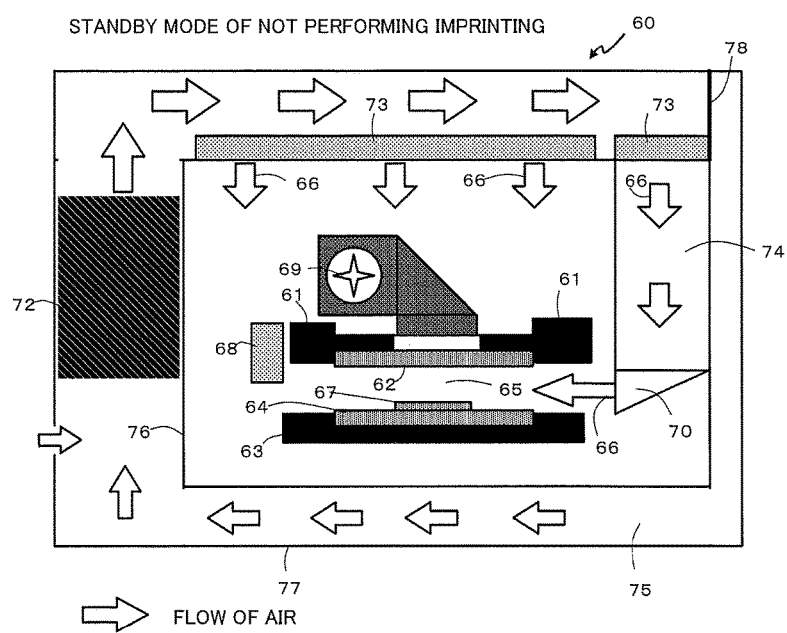
FIG. 10 is an outline schematic sectional view illustrating the relationship between the imprinting apparatus during the standby mode of not performing imprinting and the clean air in a second Example of the present invention.
Figure 11:
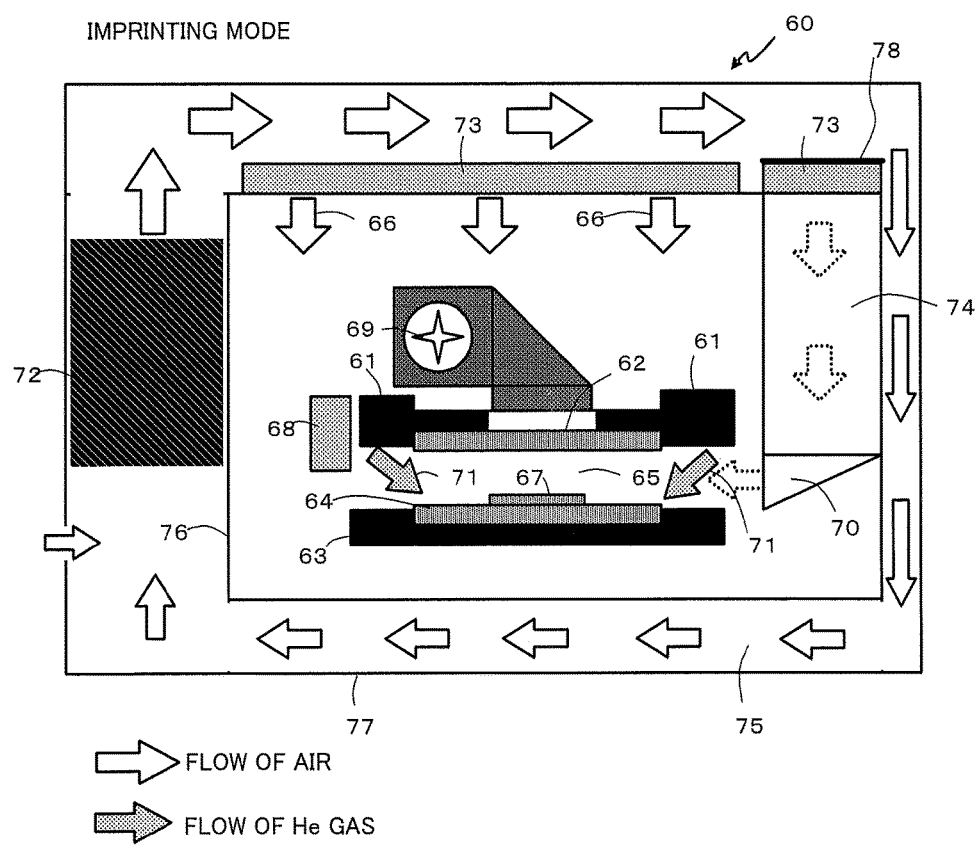
FIG. 11 is an outline schematic sectional view illustrating the relationship between the imprinting apparatus during the imprinting mode and the clean air and He gas in the second Example of the present invention.

FIG. 10 is an outline schematic sectional view illustrating the relationship between the imprinting apparatus and the clean air during the standby mode of not performing imprinting in a second Example of the present invention. FIG. 11 is an outline schematic sectional view illustrating the relationship between the imprinting apparatus and the clean air and He gas during the imprinting mode in the second Example. The outlined arrow in the view indicates the flow of air, while the arrow dotted in black and white indicates the flow of He gas.

The sites in the second Example that is different from the first Example are the position of the movable shutter 78 and the position of the return duct 75.

As illustrated in FIG. 10, the imprinting apparatus 60 of the present Example is an imprinting apparatus which uses a template 62 having a concavo-convex pattern formed thereon, and transfers the pattern of the template 62 by imprinting to a photocurable resin 67 on a transfer-receiving substrate 64, the imprinting apparatus comprising: a template retaining unit 61 that retains the template 62; a transfer-receiving substrate retaining unit 63 that retains the transfer-receiving substrate 64; a resin coating unit 68 that applies the photocurable resin 67 on the transfer-receiving substrate 64; a moving unit (not illustrated) that moves the template 62 and the transfer-receiving substrate 64 relatively to each other; a position determining unit (not illustrated) that aligns the template 62 with the transfer-receiving substrate 64; and a unit 69 that irradiates light from above the surface of the template 62 where no pattern is formed, in a state in which the template 62 is brought into contact with the photocurable resin 67, characterized in that the space between the template 62 and the transfer-receiving substrate 64 is defined as a space 65 of side flow, and clean air is sent as a gas stream to the space 65 through the air blowing port 70 during a standby mode of not performing imprinting, and the flow rate of clean air 66 in the space 65 is reduced or clean air is not sent during an imprinting mode.

As illustrated in FIG. 11, it is preferable to form the imprinting apparatus of the present Example such that in a state in which the flow rate of clean air in the space 65 is reduced or clean air is not sent during an imprinting mode, a gas such as He gas 71 that contributes to transfer is sent to the space 65. The gas such as He gas that contributes to transfer is, as described above, a gas which has a solubility in a photocurable resin higher than that of air, and has an effect of enhancing transferability by eliminating the portions that are not filled with a photocurable resin in concavities of the template. For the gas such as He gas, a unit that sends the gas to the space 65 through the air blowing port 70, or as illustrated in FIG. 11, a unit that is provided with an air blowing nozzle at the periphery of the template 62 and sends the gas to the space 65 is used.

It is preferable to form the imprinting apparatus of the present Example such that, as illustrated in FIG. 10 and FIG. 11, the imprinting apparatus comprises a first space for performing imprinting, a second space on the outer side thereof, and a first partition 76 that determines the boundary between the first space and the second space; a third space on the outer side of the second space, and a second partition 77 that determines the boundary between the second space and the third space; and the second space is provided with a fan 72 equipped with a temperature regulator, and the air coming in from the third space is subjected to circulation type air-conditioning in the second space and is sent to the first space through a ULPA (Ultra Low Penetration Air Filter) filter 73.

In the present Example, as illustrated in FIG. 10, the first space is provided with a side flow duct 74 equipped with a ULPA filter, and a gas stream of clean air is sent by side flow to the space 65 through an air blowing port 70. The clean air that fills the first space is circulated through a return duct provided in the lower part of the second space. The third space, the second space and the first space respectively control the pressure in this order so as to obtain positive pressures, and thus the influence of dust is reduced.

In the imprinting apparatus 60 of the present Example, the air blowing port 70 can change the direction of a gas stream of clean air 66 that is sent to the space 65. During the standby mode of not performing imprinting as illustrated in FIG. 10, the gas stream of clean air 66 is sent to the space 65 through the air blowing port 70; however, in the example of the imprinting mode illustrated in FIG. 11, a ULPA filter 73 connected to the side flow duct 74 is closed with a movable shutter 78, and a gas stream of clean air 66 does not flow through the side flow duct 74.

The imprinting apparatuses of the present invention disclosed in the above Examples are such that the air blowing port is freely opened and closed by a movable shutter provided in a side flow duct, and the degree of opening of the air blowing port can be changed during a standby mode of not performing imprinting and during an imprinting mode. Also, the imprinting apparatuses can send clean air as a gas stream to the space through the air blowing port during the standby mode of not performing imprinting, and can reduce the flow rate of clean air in the space or does not send clean air during the imprinting mode.

In the imprinting apparatus of the present invention, it is also possible to use the same air blowing port as the air blowing ports for sending clean air and a gas that contributes to transfer, such that a gas stream of clean air is sent during the standby mode of not performing imprinting, while the gas that contributes to transfer is sent to the space during the imprinting mode. It is because when the same air blowing port is used, the apparatus configuration can be simplified.

Furthermore, according to the present invention, different air blowing ports can be used as the air blowing ports for sending clean air and the gas that contributes to transfer.

According to the imprinting apparatus of the present invention, volatilization of a photocurable resin applied on a transfer-receiving substrate can be prevented, the wet-spreading property of the resin at the time of transfer can be maintained satisfactorily, the environment for transfer is maintained clean, the environment for transfer can be filled with a particular gas appropriate for transfer, and a high quality transfer-receiving substrate having a pattern transferred thereon can be obtained.

REFERENCE SIGNS LIST 21 template retaining unit
22 template (master template)
23 transfer-receiving substrate retaining unit
24 transfer-receiving substrate (replica blank)
25 space
26, 28 clean air
27 photocurable resin (resist)
40, 60 imprinting apparatus
41, 61 template retaining unit
42, 62 template
43, 63 transfer-receiving substrate retaining unit
44, 64 transfer-receiving substrate
45, 65 space
46, 66 clean air
47, 67 photocurable resin
48, 68 resin coating unit
49, 69 unit that irradiates light
50, 70 air blowing port
51, 71 He gas
52, 72 fan equipped with temperature regulator
53, 73 ULPA filter
54, 74 side flow duct
55, 75 return duct
56, 76 first partition
57, 77 second partition
58, 78 shutter
59 damper

The invention claimed is:
1. An imprinting apparatus, comprising:
a template holder configured to hold a template;
a transfer-receiving substrate holder configured to hold a transfer-receiving substrate;
an inkjet apparatus configured to coat a volatile photocurable resin on the transfer-receiving substrate;

a moving mechanism configured to move the template and the transfer-receiving substrate relatively to each other;
a positioning mechanism configured to position the template and the transfer-receiving substrate;
a light irradiating unit that irradiates the volatile photocurable resin with light, in a state in which the template is brought into contact with the volatile photocurable resin on the transfer-receiving substrate;
a first space for performing imprinting;
a second space outside of the first space;
an air blowing port that sends clean air from the second space to the first space,
wherein
the air blowing port is configured to change a flow direction of the clean air flowing out of the air blowing port to the first space during a standby mode of not performing imprinting, and change a flow direction of the clean air flowing out of the air blowing port so as to reduce a flow rate of the clean air to the first space during an imprinting mode, and
the air blowing port is configured to reduce the flow rate of the clean air to the first space before the transfer-receiving substrate coated with the volatile photocurable resin is moved below the template.

2. The imprinting apparatus according to claim 1, wherein the air blowing port is configured to open and close, and a degree of opening of the air blowing port is changed during the standby mode and during the imprinting mode.

3. The imprinting apparatus according to claim 1, wherein a gas that contributes to transfer is sent to the first space during the imprinting mode.

4. The imprinting apparatus according to claim 3, wherein the clean air is sent to the first space, and the gas that contributes to transfer is sent to the first space, using the air blowing port.

5. An imprinting apparatus, comprising:
a template holder configured to hold a template;
a transfer-receiving substrate holder configured to hold a transfer-receiving substrate;
an inkjet apparatus configured to coat a volatile photocurable resin on the transfer-receiving substrate;
a moving mechanism configured to move the template and the transfer-receiving substrate relatively to each other;
a positioning mechanism configured to position the template and the transfer-receiving substrate;
a light irradiating unit that irradiates the volatile photocurable resin with light in a state in which the template is brought into contact with the volatile photocurable resin on the transfer-receiving substrate;
a first space for performing imprinting where the template and the volatile photocurable resin are brought into contact;
a second space outside of the first space;
a first partition that determines a boundary between the first space and the second space;
a third space outside of the second space;
a second partition that determines a boundary between the second space and the third space;
a fan equipped with a temperature regulator located in the second space;
an air blowing unit that has an air blowing port and sends clean air, of which a temperature of the clean air is regulated by the fan, from the second space to the first space; and
an air blowing nozzle that sends a gas that contributes to transfer to the first space, wherein
clean air coming in from the third space is subjected to circulation type air-conditioning in the second space and is sent to the first space through a ULPA filter,
the air blowing unit reduces a flow rate of the clean air that is sent to the first space: (i) by changing a direction of a flow out of the air blowing unit, at least from an initiation of an application of the volatile photocurable resin on the transfer-receiving substrate to a completion of light irradiation in a state in which the template is brought into contact with the volatile photocurable resin, and (ii) by changing the direction of the flow out of the air blowing unit after the template is brought into contact with the volatile photocurable resin,
the air blowing nozzle sends the gas that contributes to transfer to the first space when the flow rate of the clean air is reduced, and
the air blowing unit is configured to reduce the flow rate of the clean air that is sent to the first space before the transfer-receiving substrate coated with the volatile photocurable resin is moved below the template.

6. The imprinting apparatus according to claim 3, wherein the gas that contributes to transfer is sent through an air blowing nozzle provided at a periphery of the first space.

7. The imprinting apparatus according to claim 3, wherein the gas that contributes to transfer is selected from a group consisting of nitrogen, helium, and pentafluoropropane.

8. An imprinting apparatus, comprising:
a template holder configured to hold a template;
a transfer-receiving substrate holder configured to hold a transfer-receiving substrate;
an inkjet apparatus configured to coat a volatile photocurable resin on the transfer-receiving substrate;
a moving mechanism configured to move the template and the transfer-receiving substrate relatively to each other;
a positioning mechanism configured to position the template and the transfer-receiving substrate;
a light irradiating unit that irradiates the volatile photocurable resin with light, in a state in which the template is brought into contact with the volatile photocurable resin on the transfer-receiving substrate;
a first space for performing imprinting where the template and the volatile photocurable resin are brought into contact;
a second space outside of the first space;
a first partition that determines a boundary between the first space and the second space;
a third space outside of the second space;
a second partition that determines a boundary between the second space and the third space;
a fan equipped with a temperature regulator in the second space; and
an air blowing port that sends clean air, of which a temperature of the clean air is regulated by the fan, from the second space to the first space,
wherein clean air coming in from the third space is subjected to circulation type air-conditioning in the second space and is sent to the first space through a ULPA filter,
the air blowing port is configured to change a flow direction of the clean air flowing out of the air blowing port to the first space during a standby mode of not performing imprinting, and change a flow direction of the clean air flowing out of the air blowing port so as to reduce a flow rate of the clean air to the first space during an imprinting mode, and the air blowing port is configured to reduce the flow rate of the clean air to the first space before the transfer-receiving substrate coated with the volatile photocurable resin is moved below the template.

* * * * *